United States Patent

Neumann et al.

[11] Patent Number: 6,130,002
[45] Date of Patent: Oct. 10, 2000

[54] PROCESS FOR PRODUCING ORGANICALLY MODIFIED OXIDE, OXYNITRIDE OR NITRIDE LAYERS BY VACUUM DEPOSITION

[75] Inventors: Manfred Neumann; Siegfried Schiller; Henry Morgner, all of Dresden; Nicolas Schiller, Helmsdorf; Steffen Straach, Dresden, all of Germany

[73] Assignee: Fraunhofer-Gesellschaft zur Forderung der angewandten Forschung e.V., Munich, Germany

[21] Appl. No.: 09/091,487

[22] PCT Filed: Dec. 13, 1996

[86] PCT No.: PCT/DE96/02434

§ 371 Date: Jul. 22, 1998

§ 102(e) Date: Jul. 22, 1998

[87] PCT Pub. No.: WO97/23661

PCT Pub. Date: Jul. 3, 1997

[30] Foreign Application Priority Data

Dec. 22, 1995 [DE] Germany .......... 195 48 160

[51] Int. Cl.$^7$ .......... B32B 9/00; H05H 1/00
[52] U.S. Cl. .......... 428/698; 428/447; 428/469; 428/702; 427/488; 427/489; 427/569; 427/576; 427/578
[58] Field of Search .......... 427/124, 249, 427/250, 295, 585, 566, 561, 569, 570, 535, 488, 489, 576, 578; 118/723 VE, 723 MW; 428/698, 470, 702, 447, 469

[56] References Cited

U.S. PATENT DOCUMENTS 4,048,349 9/1977 White et al. .................. 427/58
4,439,494 3/1984 Olson .......................... 428/412

(List continued on next page.)

FOREIGN PATENT DOCUMENTS 0470777 2/1992 European Pat. Off. .
2683230 5/1993 France .

(List continued on next page.)

OTHER PUBLICATIONS

Biederman et al., "Metal Doped Fluorocarbon Polymer Films Prepared by Plasma Polymerization Using an RF Planar Magnetron Target", *Nuclear Instruments and Methods*, vol. 212, pp.497–503 (1983).

(List continued on next page.)

*Primary Examiner*—Timothy M. Speer
*Assistant Examiner*—Stephen Stein
*Attorney, Agent, or Firm*—Greenblum & Bernstein, P.L.C.

[57] ABSTRACT

Method for producing at least one organically-modified oxide, oxinitride or nitride layer by vacuum coating on a substrate through plasma-enhanced evaporation of evaporation material comprising nitride-forming evaporation material and one of oxide and suboxide evaporation material, wherein the at least one layer is deposited through plasma-enhanced, reactive high-rate evaporation of the evaporation material with use of gaseous monomers and a reactive gas including at least one of oxygen and nitrogen, and wherein the evaporation material, gaseous monomers, and reactive gas pass through a high-density plasma zone immediately in front of the substrate. A method for producing at least one organically-modified oxide, oxinitride or nitride layer by vacuum coating on a substrate through plasma-enhanced evaporation of one of oxide and suboxide evaporation material, wherein the at least one layer is deposited through plasma-enhanced, reactive high-rate evaporation of the evaporation material with use of gaseous monomers and a reactive gas including at least one of oxygen and nitrogen, and wherein the evaporation material, gaseous monomers, and reactive gas pass through a high-density plasma zone immediately in front of the substrate. Substrates with an organically-modified oxide, oxinitride or nitride layer, as produced by the methods, wherein the at least one layer deposited by plasma-enhanced, high-rate vapor deposition includes more than 50 wt% of inorganic molecules and less than 50 wt% of partially cross-linked organic molecules.

49 Claims, 1 Drawing Sheet

U.S. PATENT DOCUMENTS

| | | | |
|---|---|---|---|
| 4,919,968 | 4/1990 | Buhl et al. | 427/37 |
| 5,453,306 | 9/1995 | Tatsumi et al. | 427/569 |
| 5,635,087 | 6/1997 | Schiller et al. | 219/121.43 |
| 5,780,803 | 7/1998 | Giedicke et al. | 219/121.43 |
| 5,855,684 | 1/1999 | Bergmann | 118/723 |

FOREIGN PATENT DOCUMENTS

| | | |
|---|---|---|
| 4239511 | 5/1994 | Germany . |
| 4412906 | 7/1995 | Germany . |
| 56-147829 | 11/1981 | Japan . |
| 2684389 | 8/1997 | Japan . |
| WO 94/09176 | 5/1994 | WIPO . |

OTHER PUBLICATIONS

Kwak et al., "Deposition of Organic–Inorganic Composite Thin Films $Li_3PO_4$ Sputtering and $C_2 H_4$ Plasma Polymerization", *Thin Solid Films*, vol. 269, pp. 6–13 (1995).

Kienel et al., *Vakuumbechichtung[Vacuum Coating]*, vol. 5, pp. 45–49 (1993).

Kasemann et al., "Coatings for Mechanical and Chemical Protection Based on Organic–Inorganic Sol–Gel Nanocomposites", *New Journal of Chemistry*, vol. 18, pp. 1117–1123 (1994).

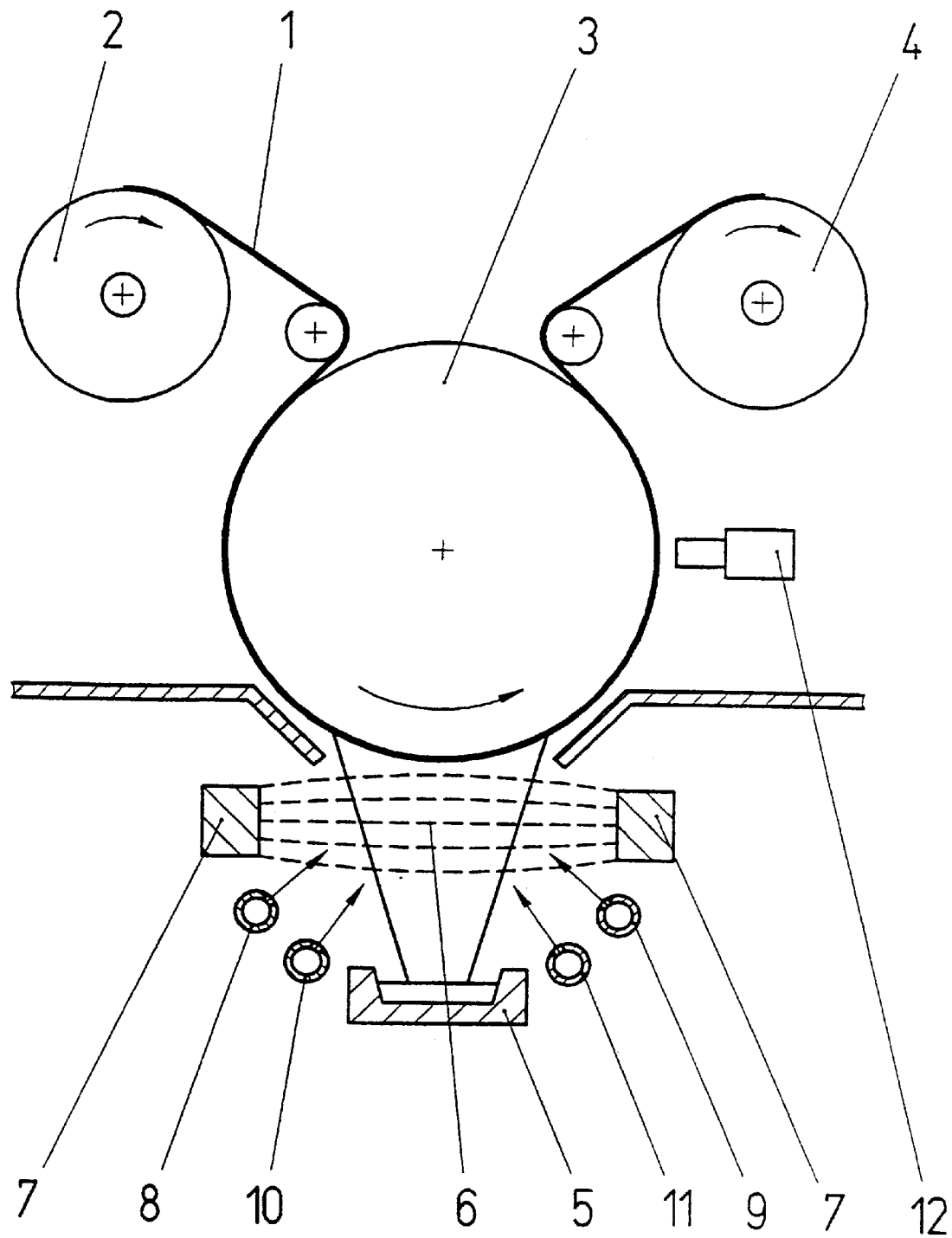

PROCESS FOR PRODUCING ORGANICALLY MODIFIED OXIDE, OXYNITRIDE OR NITRIDE LAYERS BY VACUUM DEPOSITION

BACKGROUND OF THE INVENTION

1. Field of the Invention

The invention relates to a method for producing organically-modified oxide, oxinitride or nitride layers on large areas through vacuum coating. Preferred applications of these layers are transparent barrier films for packaging materials and transparent corrosion-protective or anti-abrasion layers for window faces, mirrors, decorative surfaces, or facade coatings.

2. Discussion of Background

It is known to produce layers for these applications by varnishing with transparent varnish layers or laminating transparent plastic films. Although an adequate barrier or corrosion-protective effect can be obtained in many cases, the abrasion resistance is very low, and weather- and UV-resistance prove to be insufficient in outdoor applications.

Much higher abrasion resistances and good barrier or corrosion-protective properties can be attained with a much lower material expenditure by the application of transparent oxide layers in a vacuum. Coating takes place by vapor-deposition, sputtering, or plasma CVD techniques (G. Kienel: "Vakuumbeschichtung [Vacuum Coating]", Vol. 5, VDI-Verlag, Düsseldorf, 1993). However, inorganic oxide layers produced in this way have a much lower flexibility compared to organic layers produced by varnishing or laminating. This substantially impairs the initially very good properties of the vacuum-deposited oxide layers during use and further processing of the coated films, sheet metals, or plates. Particularly, subsequent stretching or deep-drawing of the coated materials is hardly possible.

It has already been attempted to combine the high flexibility of organic coatings with the high abrasion and weather resistance of the oxide layers. Cited as an example are the so-called called "organically-modified ceramic layers" ("ORMOCER" layers), which are produced according to the Sol-Gel process and are to be applied similarly to varnish layers (R. Kasemann, H. Schmidt: New Journal of Chemistry, Vol. 18, 1994, No. 10, Page 1117). However, they require a layer thickness similar to those of customary varnish layers. Furthermore, although their resistance to abrasion and weather is better than that of varnish layers, it is not as good as that of thin vacuum-deposited oxide layers.

Moreover, it is a known method to produce organic layers with an inorganic oxide component in a way that the organic layers are deposited by plasma polymerization in a vacuum, using organometallic or organosilicon vapors as monomers for the plasma polymerization, so that a concurrent oxygen admission results in the formation of both metallic oxide and silicon oxide molecules that will be incorporated into the growing organopolymeric layer (JP 2/99933). Depending on both the monomers and the proportion of oxygen used, the oxide component in the organic polymer layer may be varied. In this way, layers of greater or lesser hardness can be deposited that are characterized by both good abrasion resistance and good barrier and corrosion-protective properties. But a disadvantage of this method is that true-to-quality layers can be attained only at deposition rates of a few nanometers per second. Hence, this technique proves to be unsuitable for the economical coating of large areas.

It is known to apply a layer comprising an inorganic component and an organic component to a substrate for improving gas imperviousness, with the organic component being non-uniformly distributed in the layer in the monomer state (EP 0 470 777 A2). The disadvantage of this method is that the layer is too brittle for further processing, and the vapor-deposition rates attainable with this method are too low.

Also known is a method of ion-assisted vacuum coating, in which a plasma is used to generate ions. In this method, ions are accelerated toward the substrate through the application of alternatingly positive and negative voltage pulses, relative to the plasma, between the substrate and a coating source (DE 44 12 906 C1). A disadvantage is that the layers produced in this manner are too hard for subsequent processing of the coated substrate.

It is known to produce oxide-polymer dispersion layers through simultaneous evaporation of polymers and metals with two evaporation sources (U.S. Pat. No. 4,048,349). This method is very costly, however, and, in addition, a subsequent thermal treatment must be performed for oxidation.

SUMMARY OF THE INVENTION

It is an object of the invention to create a method for the production of organically-modified oxide, oxinitride or nitride layers by vacuum coating that facilitates high deposition rates needed for coating of large areas and allows for the deposition of layers that, according to the intended application, are characterized either by good barrier properties, corrosion-protective properties or anti-abrasion properties, and possess a flexibility with which the good properties are sufficiently maintained during further processing and use in practice. Extensive homogeneity is intended to be attained over large areas. Moreover, it is an aim of the invention to produce a substrate with a coating that possesses the aforementioned properties. The substrates should be strip-shaped or sheet-type substrates of arbitrary material.

An essential starting point of the method is the plasma-enhanced reactive deposition of oxide layers known per se, in which the required high deposition rates as well as the required hardness and abrasion resistance of the layers can be achieved. Surprisingly, it has been found that the additional admission of even small quantities of a suitable monomer into the vapor-deposition zone causes an unexpectedly distinct modification of the otherwise brittle oxide layers toward a higher flexibility, i.e., an increased ductility and bendability. In addition, a higher corrosion-protective effect and a better barrier effect against the diffusion of gases and vapors are attained. To attain prerequisite for attaining these effects it is important that the reactive gas and the monomers are introduced near the substrate and at a preferred direction toward the substrate site to be coated, and that--together with the evaporated, oxide- or nitride-forming elements--they pass through a plasma zone of high density immediately before they impact the substrate. The admission of reactive gas and monomers with a preferred direction toward the substrate minimizes unwanted scatter effects, and therefore ensures that the desired components of reactive gas and monomer molecules at the substrate surface are already obtained with relatively-low gas flows and total pressures. In this way, a higher packing density of the layer molecules is attained. The passage through this high-density plasma zone prior to impact at the substrate has a decisive influence on the layer structure and the resulting layer properties.

Here the molecules and atoms of the evaporated oxide- or nitride-forming element, as well as the molecules of the reactive gas and the monomers, are excited, and partly ionized, such that they form a dense inorganic-organic molecular network in the growing layer.

The same effect also occurs if, instead of the oxide- or nitride-forming elements such as silicon, aluminum or other reactive metals, their oxides or suboxides are evaporated, whereby the quantity of the admitted reactive gas can be reduced accordingly. This procedure is of particular advantage if the corresponding oxides/nitrides or suboxides/subnitrides are less expensive than the oxide- or nitride-forming elements themselves, such as silicon dioxide (quartz) compared to silicon. But in most cases, e.g., with aluminum, the oxide-forming elements are less expensive and easier to evaporate than the corresponding oxides or suboxides.

For particular applications it may also be of advantage if the layer properties vary gradually over the layer thickness. With abrasion-resistant layers on plastic film, for instance, it is advantageous if the layers on the side facing the substrate are less hard, and therefore better matched to the plastic substrate, whereas it is desirable for the layer surface facing away from the substrate to have a greater hardness. Such a gradient layer structure can also be obtained if the substrates to be coated is moved over the vapor-deposition zone at a constant speed, and if the admission of either the reactive gas or monomers, or the center of the plasma zone, is not located in the center of the vapor-deposition zone but, with respect to the direction of substrate motion, closer to the beginning or end of the vapor-deposition zone. If these sites are arranged near the beginning of the vapor-deposition zone, they have a stronger influence on the layer side facing the substrate, whereas an arrangement near the end of the zone mainly influences the side facing away from the substrate, i.e., the layer surface. Generally, a larger reactive gas component yields a higher transparency and a greater hardness, but often also a lower flexibility, of the layer. On the other hand, a larger monomer component can increase the flexibility of the layer, although the hardness is somewhat reduced. Finally, an increase in plasma density can permit an enhancement of the hardness and adhesion strength of the layers, and also influence the transparency of the layers. Hence, the mean value as well as the local distribution of reactive gas, monomer and plasma density can be used to vary both the mean value and the gradient of the layer properties over the layer thickness within wide limits. The most favorable mean values and local distributions have to be determined experimentally in accordance with the application concerned.

In accordance with one aspect, the present invention is directed to a method for producing at least one organically-modified oxide, oxinitride or nitride layer by vacuum coating on a substrate through plasma-enhanced evaporation of one of an oxide- and nitride-forming evaporation material, wherein the at least one layer is deposited through plasma-enhanced, reactive high-rate evaporation of the evaporation material with use of gaseous monomers and a reactive gas comprising at least one of oxygen and nitrogen, and wherein the evaporation material, gaseous monomers, and reactive gas pass through a high-density plasma zone immediately in front of the substrate.

In accordance with another aspect, the present invention is directed to a method for producing at least one organically-modified oxide, oxinitride or nitride layer by vacuum coating on a substrate through plasma-enhanced evaporation of evaporation material comprising nitride-forming evaporation material and one of oxide and suboxide evaporation material, wherein the at least one layer is deposited through plasma-enhanced, reactive high-rate evaporation of the evaporation material with use of gaseous monomers and a reactive gas comprising at least one of oxygen and nitrogen, and wherein the evaporation material, gaseous monomers, and reactive gas pass through a high-density plasma zone immediately in front of the substrate.

In still another aspect, the present invention is directed to a substrate with an organically-modified oxide, oxinitride or nitride layer, wherein the at least one layer deposited by plasma-enhanced, high-rate vapor deposition comprises more than 50 wt% of inorganic molecules and less than 50 wt% of partially cross-linked organic molecules.

In another aspect, the evaporation material, gaseous monomers, and reactive gas are directed toward the substrate.

In still another aspect, the at least one layer is deposited at a coating rate of at least 10 nm/s. The coating rate may be 20 to 1000 nm/s.

In yet another aspect, the high-density plasma zone has a density of at least $10^9$ cm$^{-3}$. The high-density plasma zone may have a density of $10^{10}$ to $10^{12}$ cm$^{-3}$. The high-density plasma zone may have a density of $10^9$ cm$^{-3}$ to $10^{10}$ cm$^{-3}$.

In another aspect, the plasma-enhanced, reactive, high-rate evaporation is carried out by one of diffuse arc discharge, pulsed magnetron discharge, non-pulsed magnetron discharge, and electron cyclotron resonance (ECR) microwave discharge.

In still another aspect, the evaporation material comprises one of metal and metal alloy. The evaporation material may also comprise one of silicon and aluminum.

In another aspect, the gaseous monomers comprise at least one of polymerizable hydrocarbon, organometallic compound, organosilicon compound, and organofluorine compound. The gaseous monomers may comprise hexamethylene disiloxane.

In another form, the substrate to be coated is uniformly moved over a vapor-deposition zone. The reactive gas may enter the vapor-deposition zone at one of a beginning, a center, and an end of the vapor-deposition zone with respect to the direction of substrate motion. The gaseous monomers may enter the vapor-deposition zone at one of a beginning, a center, and an end of the vapor-deposition zone with respect to the direction of substrate motion. The high-density plasma zone may be expanded, with respect to the direction of substrate motion, so that the high-density plasma zone is located at one of a beginning, an end, and nearly an entirety of the vapor-deposition zone.

In another aspect, the at least one layer comprises more than 50 wt% of inorganic molecules. The at least one layer may comprise more than 80 wt% of inorganic molecules.

In still another aspect, the inorganic molecules comprise one of an oxide, oxinitride, and nitride of one of silicon and metal. The metal may be aluminum.

In yet another aspect, the partially cross-linked organic molecules comprise at least one of carbon, silicon, metal, and fluorine.

In another aspect, a concentration of organic molecules in the at least one layer decreases from a layer side facing the substrate to a layer side facing away from the substrate.

In yet another aspect, a concentration of at least one of oxygen and nitrogen in the at least one layer increases from a layer side facing the substrate to a layer side facing away from the substrate.

BRIEF DESCRIPTION OF THE DRAWING

The accompanying drawing shows a device for performing the method.

DETAILED DESCRIPTION

The substrate 1 to be coated is a plastic film that is provided with a highly-reflective metal layer intended for large-area solar reflectors in solar power stations, and requires a highly-transparent, abrasion-resistant, corrosion-protective and weather-resistant protective layer. The substrate 1 to be coated is guided, at a constant speed, from a take-off reel 2 via a cooling drum 3 to an take-up reel 4. At a bottom side of the cooling drum 3, aluminum is evaporated as an oxide-forming element from a series of resistance-heated boat evaporators 5. To evaporate other oxide-forming elements such as titanium or zirconium, or for evaporating oxides or suboxides such as $SiO_2$ or $SiO$, it is possible to employ electron-beam evaporators or other high-rate evaporator sources instead of the boat evaporators 5. Two magnetrons 7 that are pulsed at about 50 kHz in bipolar mode are used to generate the high-density plasma zone 6 immediately in front of the substrate. Arranged below the plasma zone 6 are two nozzle tubes 8, 9 for the admission of oxygen as reactive gas, and two nozzle tubes 10, 11 for the admission of the monomer hexamethylene disiloxane (HMDSO). The nozzle tubes 8, 9, 10, 11 are directed toward the site to be coated on the substrate 1 to ensure reactive gas and monomer and the lowest possible pressure in the coating chamber.

After setting the desired aluminum evaporation rate with the aid of the boat evaporators 5, and after setting the optimum plasma density in the plasma zone 6 as determined by preliminary tests, the oxygen flow through the nozzle tubes 8 and 9 is increased by equal amounts until an aluminum oxide layer having the required high transparency has been attained. The transparency of the deposited layer is measured with the aid of a reflection spectrometer 12. After that, the monomer flow through the nozzle tubes 10 and 11 is set at the optimum value determined by preliminary tests. In general, it proves to be suitable to set a higher flow through the nozzle tube 10 than in the nozzle tube 11. Often, the monomer admission will result in a reduced transparency of the deposited layer that can be largely compensated by a further oxygen admission. In the interest of substantial surface hardness of the layer, it is also suitable to admit the additional oxygen mainly through the nozzle tube 9.

What is claimed is:

1. A method for producing at least one organically-modified oxide, oxinitride or nitride layer by vacuum coating on a substrate through plasma-enhanced evaporation of one of an oxide-and nitride-forming evaporation material, wherein the at least one layer is deposited through plasma-enhanced, reactive high-rate evaporation of the evaporation material with use of gaseous monomers and a reactive gas comprising at least one of oxygen and nitrogen, and wherein the evaporation material, gaseous monomers, and reactive gas pass through a high-density plasma zone immediately in front of the substrate.

2. The method of claim 1, wherein the evaporation material, gaseous monomers, and reactive gas are directed toward the substrate.

3. The method of claim 1, wherein the at least one layer is deposited at a coating rate of at least 10 nm/s.

4. The method of claim 1, wherein the at least one layer is deposited at a coating rate of 20 to 1000 nm/s.

5. The method of claim 1, wherein the high-density plasma zone has a density of at least $10^9$ $cm^{-3}$.

6. The method of claim 1, wherein the high-density plasma zone has a density of $10^{10}$ to $10^{12}$ $cm^{-3}$.

7. The method of claim 1, wherein the high-density plasma zone has a density of $10^9$ $cm^{-3}$ to $10^{10}$ $cm^{-3}$.

8. The method of claim 1, wherein the plasma-enhanced, reactive high-rate evaporation is carried out by one of diffuse arc discharge, pulsed magnetron discharge, non-pulsed magnetron discharge, and electron cyclotron resonance microwave discharge.

9. The method of claim 1, wherein the evaporation material comprises one of metal and metal alloy.

10. The method of claim 1, wherein the evaporation material comprises one of silicon and aluminum.

11. The method of claim 1, wherein the gaseous monomers comprise at least one of polymerizable hydrocarbon, organometallic compound, organosilicon compound, and organofluorine compound.

12. The method of claim 1, wherein the gaseous monomers comprise hexamethylene disiloxane.

13. The method of claim 1, wherein the substrate to be coated is uniformly moved over a vapor-deposition zone.

14. The method of claim 13, wherein the reactive gas enters the vapor-deposition zone at one of a beginning, a center, and an end of the vapor-deposition zone with respect to the direction of substrate motion.

15. The method of claim 13, wherein the gaseous monomers enter the vapor-deposition zone at one of a beginning, a center, and an end of the vapor-deposition zone with respect to the direction of substrate motion.

16. The method of claim 13, wherein the high-density plasma zone is expanded, with respect to the direction of substrate motion, so that the high-density plasma zone is located at one of a beginning, an end, and nearly an entirety of the vapor-deposition zone.

17. A The method of claim 1, wherein the at least one layer comprises more than 50 wt% of inorganic molecules.

18. The method of claim 1, wherein the at least one layer comprises more than 80 wt% of inorganic molecules.

19. A substrate with an organically-modified oxide, oxinitride or nitride layer, as produced by the method according to claim 1, wherein the at least one layer deposited by plasma-enhanced, high-rate vapor deposition comprises more than 50 wt% of inorganic molecules and less than 50 wt% of partially cross-linked organic molecules and wherein a concentration of organic molecules in the at least one layer decreases from a layer side facing the substrate to a layer side facing away from the substrate.

20. The substrate of claim 19, wherein the at least one layer comprises more than 80 wt% of inorganic molecules.

21. The substrate of claim 19, herein the at least one layer comprises less than 20 wt% of partially cross-linked organic molecules.

22. The substrate of claim 19, wherein the inorganic molecules comprise one of an oxide, oxinitride, and nitride of one of silicon and metal.

23. The substrate of claim 22, wherein the inorganic molecules comprise metal comprising aluminum.

24. The substrate of claim 19, wherein the partially cross-linked organic molecules comprise at least one of carbon, silicon, metal, and fluorine.

25. The substrate of claim 19, wherein the partially cross-linked organic molecules comprise hexamethylene disiloxane.

26. The substrate of claim 19, wherein a concentration of at least one of oxygen and nitrogen in the at least one layer increases from a layer side facing the substrate to a layer side facing away from the substrate.

27. A method for producing at least one organically-modified oxide, oxinitride or nitride layer by vacuum coating on a substrate through plasma-enhanced evaporation of evaporation material comprising nitride-forming evaporation material and one of oxide and suboxide evaporation material, wherein the at least one layer is deposited through plasma-enhanced, reactive high-rate evaporation of the evaporation material with use of gaseous monomers and a reactive gas comprising at least one of oxygen and nitrogen, and wherein the evaporation material, gaseous monomers, and reactive gas pass through a high-density plasma zone immediately in front of the substrate.

28. The method of claim 27, wherein the evaporation material comprises one of silicon dioxide and silicon monoxide.

29. The method of claim 27, wherein the evaporation material, gaseous monomers, and reactive gas are directed toward the substrate.

30. The method of claim 27, wherein the at least one layer is deposited at a coating rate of at least 10 nm/s.

31. The method of claim 27, wherein the at least one layer is deposited at a coating rate of 20 to 1000 nm/s.

32. The method of claim 27, wherein the high-density plasma zone has a density of at least $10^9$ cm$^{-3}$.

33. The method of claim 27, wherein the high-density plasma zone has a density of $10^{10}$ to $10^{12}$ cm$^{-3}$.

34. The method of claim 27, wherein the high-density plasma zone has a density of $10^9$ cm$^{-3}$ to $10^{10}$ cm$^{-3}$.

35. The method of claim 27, wherein the plasma-enhanced, reactive high-rate evaporation is carried out by one of diffuse arc discharge, pulsed magnetron discharge, non-pulsed magnetron discharge, and electron cyclotron resonance microwave discharge.

36. The method of claims 27, wherein the gaseous monomers comprise at least one of polymerizable hydrocarbon, organometallic compound, organosilicon compound, and organofluorine compound.

37. The method of claim 27, wherein the gaseous monomers comprise hexamethylene disiloxane.

38. The method of claim 27, wherein the substrate to be coated is uniformly moved over a vapor-deposition zone.

39. The method of claim 38, wherein the reactive gas enters the vapor-deposition zone at one of a beginning, a center, and an end of the vapor-deposition zone with respect to the direction of substrate motion.

40. The method of claim 38, wherein the gaseous monomers enter the vapor-deposition zone at one of a beginning, a center, and an end of the vapor-deposition zone with respect to the direction of substrate motion.

41. The method of claim 38, wherein the high-density plasma zone is expanded, with respect to the direction of substrate motion, so that the high-density plasma zone is located at one of a beginning, an end, and nearly an entirety of the vapor-deposition zone.

42. The method of claim 27, wherein the at least one layer comprises more than 50 wt% of inorganic molecules.

43. The method of claim 27, wherein the at least one layer comprises more than 80 wt% of inorganic molecules.

44. A substrate with an organically-modified oxide, oxinitride or nitride layer, as produced by the method according to claim 27, wherein the at least one layer deposited by plasma-enhanced, high-rate vapor deposition comprises more than 50 wt% of inorganic molecules and less than 50 wt% of partially cross-inked organic molecules and wherein a concentration of organic molecules in the at least one layer decreases from a layer side facing the substrate to a layer side facing away from the substrate.

45. The substrate of claim 44, wherein the at least one layer comprises more than 80 wt% of inorganic molecules.

46. The substrate of claim 44, wherein the at least one layer comprises less than 20 wt% of partially cross-linked organic molecules.

47. The substrate of claim 44, wherein the partially cross-linked organic molecules comprise at least one of carbon, silicon, metal, and fluorine.

48. The substrate of claim 44, wherein the partially cross-linked organic molecules comprise hexamethylene disiloxane.

49. The substrate of claim 44, wherein a concentration of at least one of oxygen and nitrogen in the at least one layer increases from a layer side facing the substrate to a layer side facing away from the substrate.

* * * * *